United States Patent [19]

Ohno et al.

[11] 4,431,268
[45] Feb. 14, 1984

[54] REFLECTOR AND METHOD FOR MANUFACTURING THE SAME

[75] Inventors: Akira Ohno; Hajime Shimabukuro; Shitomi Katayama, all of Yokohama, Japan

[73] Assignee: NHK Spring Co., Ltd., Yokohama, Japan

[21] Appl. No.: 333,283

[22] Filed: Dec. 22, 1981

[30] Foreign Application Priority Data

Jun. 26, 1980 [JP] Japan .................................. 55-87147

[51] Int. Cl.³ .............................................. G02B 5/08
[52] U.S. Cl. .................................. 350/288; 350/590; 428/631; 428/654; 427/162; 204/130
[58] Field of Search ....................... 350/288, 320, 590; 427/162; 428/631, 654; 204/130

[56] References Cited

U.S. PATENT DOCUMENTS 4,358,507 11/1982 Senaha et al. ....................... 350/288
4,364,637 12/1982 Ohno et al. ......................... 350/288
4,379,196 4/1983 Halper ................................ 427/162

FOREIGN PATENT DOCUMENTS 50-40348 9/1975 Japan .................................. 350/288
52-10741 1/1977 Japan .................................. 350/320
54-97155 8/1979 Japan .................................. 350/320

Primary Examiner—Jon W. Henry

[57] ABSTRACT

A reflector has a base body which is made of a metallic material having an ionization potential substantially higher than that of aluminum. An aluminum reflecting layer is formed on one surface of the base body by vacuum deposition. Furthermore, a light-transmitting water-insoluble inorganic oxide layer is formed on the aluminum reflecting layer. The light-transmitting inorganic oxide layer has its micropores sealed by $H_2O$ or a carboxylate of an iron family element having a low valence. An insulating layer is formed to cover at least the other surface and the peripheral side of the base body.

25 Claims, 3 Drawing Figures

REFLECTOR AND METHOD FOR MANUFACTURING THE SAME

BACKGROUND OF THE INVENTION

I. Field of the Invention

The present invention relates to a reflector and a method for manufacturing the same and, more particularly, to an aluminum reflector which has good resistance to corrosion and a method for manufacturing the same.

II. Description of the Prior Art

An aluminum reflector is conventionally used for a reflecting shade for illumination, a parabolic reflector and the like. This aluminum reflector is constituted by an aluminum reflecting layer supported by a base body made of, for example, aluminum. The aluminum reflecting layer is generally coated with a light-transmitting inorganic oxide layer in order to prevent it from being degraded by the outer atmosphere.

The aluminum reflector of this type has advantages of good hardness, resistance to abrasion, oil resistance, heat resistance and the like by the presence of the light-transmitting inorganic oxide layer. However, this aluminum reflector does not have good resistance to chemicals. Therefore, the aluminum reflector is degraded by carbon dioxide, nitrogen monoxide, nitrogen dioxide, sulfurous acid gas, ammonia or the like which are contained in the air, so that the aluminum reflector may not be used with a desired performance for a long period of time.

The conventional aluminum reflector has another drawback in that the aluminum constituting the reflecting layer and the base body may be dissolved and corroded when the reflector is immersed into an electrolyte solution together with a metal which has a substantially higher ionization tendency, although when present alone in the electrolyte solution, the reflector may not be dissolved and corroded. Therefore, if the base body is made of a metallic material having an ionization potential substantially higher than that of aluminum, the aluminum reflecting layer is corroded and dissolved even when the reflector is present alone in an electrolyte solution.

SUMMARY OF THE INVENTION

It is an object of the present invention to provide a reflector which has high resistance to chemicals, and thus can be used for a long period of time with a desired performance.

It is another object to provide an aluminum reflector which includes a base body made of a metallic material having an ionization potential substantially higher than that of aluminum and which is not corroded or dissolved when present in an electrolyte solution.

These and other objects which will be apparent from the following detailed description have been achieved according to the present invention by providing a reflector comprising: a base body made of a metallic material having an ionization potential substantially higher than that of aluminum; an aluminum reflecting layer vacuum deposited on one surface of said base body directly or through a smoothing layer formed on the base body; a light-transmitting water-insoluble inorganic oxide layer vacuum deposited on said reflecting layer; an insulating layer covering at least the other surface and peripheral sides of said base body; and a sealing agent comprising $H_2O$ or a carboxylate of an iron family element of low valence and sealing micropores of said inorganic oxide layer.

The present invention is based on the inventors' finding that the weak chemical resistance of the conventional aluminum reflector is inevitable because the protective inorganic oxide layer has, in view of its molecular arrangement, a low density—that is, the layer has a number of micropores—and a corrosive chemical may pass through the pores and reach the aluminum reflecting layer. That is, the inorganic oxide layer is either an amorphous layer or an unstable crystalline layer having a low density and thus a number of micropores if it is formed by vacuum deposition from an amorphous inorganic oxid and even from a crystalline inorganic oxid. According to the present invention, the micropores are sealed with a sealing agent to be described later.

DETAILED DESCRIPTION OF THE PREFERRED EMBODIMENTS

Figure 1:
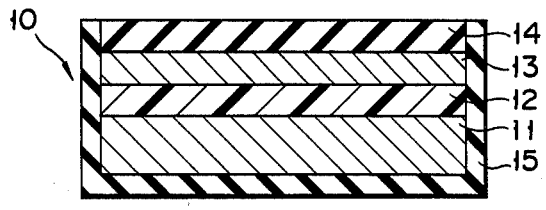
FIG. 1 is a sectional view illustrating the basic structure of a reflector according to the present invention.

The present invention will be described in detail with reference to the accompanying drawings. The same reference numerals denote the same parts.

FIG. 1 shows the basic structure of a reflector according to the present invention. Referring to FIG. 1, a reflector 10 has a support member, that is, a base body 11 which is made of a metallic material having an ionization potential substantially higher than that of aluminum. The term "metallic material" having an ionization potential substantially higher than that of aluminum is intended to mean those metals having an ionization potential equal to or higher than that of zinc, in the ionization series of K, Na, Ca, Mg, Al, Zn, Fe, Ni, Sn, Pb, (H), Cu, Hg, Ag, Pt, and Au. The metallic material of this type may be selected from iron, steel, stainless steel, nickel, chromium, copper, tin, zinc or an alloy thereof.

One surface of the base body 11 is cleaned by an appropriate method, and further may be smoothed as needed. Cleaning may be performed by a known method, such as cleaning with an acid or an alkali, treatment with an oxidizing agent or a reducing agent, or electrolysis. Smoothing can be performed by a buff-polishing or chemical polishing.

A smoothing layer 12 is formed on the cleaned surface of the base body 11 as needed (i.e., when the surface of the base body 11 is not smoothed). The smoothing layer 12 may be formed by coating and hardening or baking an inorganic compound paint which can withstand vacuum deposition to be described later, such as an enamel or silicon oxide paint, or a high polymer paint which can withstand vacuum deposition, such as a polycarbonate paint, a polyallylcarbonate paint, an epoxy paint, a polyimide paint, a polysiloxane paint or the like.

An aluminum layer 13 which constitutes a reflecting layer is formed on the surface of the smoothing layer 12 (or it may be formed directly on the base body 11 when the base body 11 is smoothed) by vacuum deposition. The term "vacuum deposition" as used herein is intended to mean a method wherein a desired material (aluminum in this embodiment) is vaporized or ionized under reduced pressure to be deposited on a substrate (the base body 11 or the smoothing layer 12 in this embodiment) and includes well known methods such as vapor deposition, ion plating, sputtering or the like. The aluminum reflecting layer 13 is formed to a thickness of, preferably, 500 to 2,000 Å.

A light-transmitting water-insoluble inorganic oxide layer 14 which constitutes a protective layer for the reflecting layer 13 is formed on the surface of the aluminum reflecting layer 13 by vacuum deposition. The protective layer 14 is formed by vacuum-depositing a silicon oxide compound such as silicon dioxide, silicon monoxide or glasses; a single ceramic such as aluminum oxide, magnesium oxide, zirconium oxide, indium oxide or tin oxide; or a compound ceramic such as pyroceram, lithia ceramic or spinel. The protective layer 14 is formed to a thickness of, preferably, 0.5 to 5 μm.

The protective layer 14 as vacuum-deposited has low resistance to chemicals since a number of micropores are present therein as described above. The protective layer 14 is treated with a sealing agent. The sealing agent includes $H_2O$ or a carboxylate of an iron family element of low valence (that is, Fe (II), Co (II) or Ni (II)). However, since the ionization potential of the base body 11 is higher than that of the reflecting layer 13, a partial cell may be formed between the base body and the reflecting layer when the sealing treatment is conducted as they are. As a result, the reflecting layer is corroded from its peripheral sides.

In order to prevent the partial cell formation, an insulating layer 15 is formed in the embodiment of FIG. 1 so as to cover the peripheral sides of the base body 11, the smoothing layer 12, the aluminum reflecting layer 13 and the protective layer 14, and the other surface (lower surface) of the base body 11, before the sealing treatment. The insulating layer can be formed of a material as described with reference to the smoothing layer.

After the insulating layer 15 is formed, the micropores of the protective layer 14 is sealed.

The carboxylate is a water-soluble iron family metal salt of alkylcarboxylic acid, hydroxyalkylcarboxyic acid, aralkylcarboxylic acid, hydroxyaralkylcarboxylic acid, cycloalkylcarboxylic acid, hydroxycyclocarboxylic acid, or a mixture thereof. Examples of the carboxylate used in the present invention includes acetate, propionate, lactate, citrate, tartarate or a mixture thereof. The metal salts of nonvolatile carboxylic acid, such as lactate, citrate, tartarate and the like are very stable and are particularly suitable for sealing at high temperatures.

In order to seal the micropores of the protective layer 14 using the carboxylate, the protective layer 14 is sprayed with or immersed in an aqueous solution of the carboxylate under the normal atmospheric pressure or a higher pressure and at a temperature of 0° to 200° C. (without boiling) for 1 second to 1 hour. The simplest method is that the protective layer 14 is immersed in the aqueous solution at room temperature to a temperature of 100° C. under the ambient pressure. The aqueous solution may contain the carboxylate at the saturation concentration. However, in general, the concentration of the carboxylate is preferably 5 to 30%. When the concentration of the carboxylate is low, the treatment requires more time. Preferably, a corresponding free carboxylic acid is dissolved in the aqueous solution, because if the carboxylic acid used is volatile, the acid component may be lost due to evaporation so that the iron family metal ion of low valence in the solution is changed to an ion of high valence, thus disabling the sealing effect.

In order to perform the sealing at high speed, an intermediate product of the reflector which is not treated with the sealing agent is immersed in the aqueous solution of the carboxylate, and electrolysis is performed using the base body as a cathode and a piece of metal as an anode which is the same kind of metal as that of the carboxylate used. In this case, the electrolytic conditions may vary dependent on the type and concentration of the aqueous solution, the thickness of the base body, or the like. However, it is preferable that the electrolysis be performed with a voltage of 10 V or less and a current density of 500 mA/cm² or less for a few seconds to 1 hour.

Further, the sealing of the micropores of the protective layer can be effected by using boiling water or water vapor. In such cases, the sealing is conducted under the conditions (temperature and/or time) such that the protective layer is not peeled off the reflecting layer and yet the sealing is accomplished. Specifically, the protective layer is immersed in boiling water at a pH of 5–9 for a period of time within 20 minutes, preferably 5 minutes, under a temperature of 95° C. or more. Alternatively, the protective layer is treated with saturated water vapor at 100° C. for 5 to 20 minutes, at 150° C. for 2 to 10 minutes, or at 200° C. for 1 to 5 minutes, for example. The maximum vapor temperature is 200° C.

After the protective layer has its micropores sealed, it is sufficiently washed with water and dried to prepare a reflector product of the present invention. The sealing mechanism by the carboxylate is not clear. However, it is assumed that the carboxylate passes through the micropores of the protective layer 14 and reaches the surface of the aluminum reflecting layer 13 so that the carboxylate reacts with aluminum on the uppermost layer of the aluminum reflecting layer 13 to form a chelate, and the volume of the carboxylate increases to seal the micropores. $H_2O$ enters the micropores and react with the inorganic oxide to form a hydrate therewith, thus increasing the volume of the oxide layer and sealing the micropores.

The insulating layer need not cover all the side faces of the base body 11, the smoothing layer 12, the reflecting layer 13 and the protective layer 14 and the bottom surface of the base body, as shown in FIG. 1. For the purposes of the invention it suffices for the insulating layer to cover at least the side faces and the lower surface of the base body 11. For this purpose, the embodiments are shown in FIGS. 2 and 3.

Figure 2:
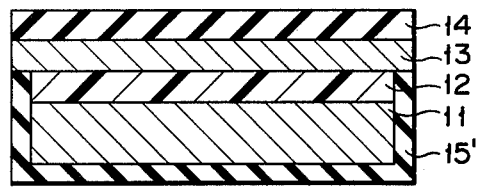
FIGS. 2 and 3 are sectional views of other embodiments of the reflector according to the present invention.

FIG. 2 shows a structure in which an insulating layer 15' covers only the side faces and the lower surface of the base body 11 and the side faces of the smoothing layer 12. In order to form this structure, the smoothing layer 12 is formed on the base body 11 as needed and then the insulating layer 15' is formed. Thereafter, the reflecting layer 13 and the protective layer 14 are formed and finally the micropores of the protective layer 14 is sealed.

Figure 3:
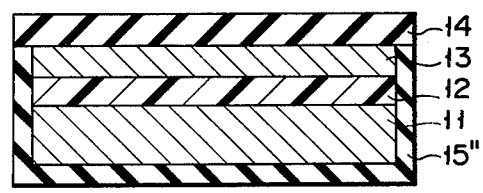

FIG. 3 shows a structure in which an insulating layer 15" covers the side faces and the bottom surface of the base body 11 and the side faces of the smoothing layer 12 and the reflecting layer 13. In order to form this structure, after the smoothing layer 12 and the reflecting layer 13 are formed on the base body 11, the insulating layer 15" is formed. Thereafter, the protective layer 14 is formed and its micropores are sealed.

For obtaining the structures as shown in FIGS. 2 and 3, the insulating layers 15' and 15" must be made of a material which can withstand the vacuum deposition to be performed, that is, a material which has heat resistance and which contains little, if any, volatile solvent or the like. In order to accomplish the structure of FIG. 1, the above consideration is not required, and the reflecting layer 13 and the protective layer 14 are sequentially formed, thus simplying the manufacturing step.

In the reflector according to the present invention, the protective layer has its micropores sealed so that the reflector has strong resistance to acid, alkali and salts as compared with the conventional reflector. Further, the reflecting mirror, according to the present invention, has the insulating layer which covers the side faces and the lower surface of the base body so that the reflector may not be corroded in an electrolyte solution. The reflector according to the present invention has also higher reflectivity than a conventional reflector mirror. Therefore, the reflector of the present invention may be used with predetermined performance for a long period of time for a parabolic reflector for a solar plant, a reflector for air-conditioning and hot-water supply for family and business use, a reflecting lamp shade for illumination equipment, a reflecting mirror and a heat-collecting mirror for a copying machine, a lightweight mirror, a reflecting mirror for interior decoration, a reflecting mirror for automobile headlights, and the like.

Examples of the present invention will be described below.

EXAMPLE 1

On the surface of a degreased stainless steel plate of 0.4 mm thickness was applied a mixed solution obtained by adding 2 parts of a 25% xylene solution of a curing agent consisting of nickel acetate and ethylene diamine in the mixing ratio of 1:1 to 100 parts of a 60% xylene solution of a phenylmethylsilicone resin containing 83.6 mol % of the phenyl group. The applied solution was dried with air. The plate was then heated at 130° C. for 5 hours and at 230° C. for 15 hours to cure the resin. The smoothing layer was thus formed.

Aluminum was vapor-deposited on the smoothing layer to a thickness of 1,500 Å and silicon dioxide was then vapor-deposited thereon to a thickness of 1.5 $\mu$ to form the reflecting layer and the protective layer, respectively. Thus, an intermediate product was prepared. An acrylic resin was coated on all the side faces and the other (lower) surface of the base body of the intermediate product.

The intermediate product was immersed for 30 minutes in a solution obtained by adding 100 ml of distilled water to 100 ml of a saturated aqueous solution of nickel acetate (II) to seal the micropores of the protective layer. The intermediate product was removed from the aqueous solution of the sealing agent, cleaned with distilled water, and dried with air. Thus, a desired reflector was thus prepared.

On the protective layer of the thus obtained reflector was dripped a 15% aqueous solution of hydrochloric acid or a 15% aqueous solution of sodium hydroxide. The reflecting mirror was left to stand for 30 minutes, washed with water and dried with air. Then, to evaluate the bonding between the protective layer and the reflecting layer, a test was conducted. A cellophane tape with an adhesive layer on it was put on the protective layer and peeled therefrom (cellophane tape test). No fragments of the protective layer were sticked to the cellophane tape.

COMPARATIVE EXAMPLE 1

In order to prepare a reflector, the same procedure was repeated as in Example 1, except that the insulating layer was not formed. When the sealing treatment was conducted, most of the aluminum reflecting layer was peeled off.

EXAMPLE 2

The same procedure was repeated as in Example 1 up to the formation of the aluminum reflecting layer, except that a degreased and rust-removed copper plate of 0.6 mm thickness was used instead of the stainless steel plate. An epoxy resin was coated on the lower surface and the side faces of the base body and cured to form the insulating layer. A sapphire protective layer was formed on the reflecting layer to a thickness of 2 $\mu$ by vacuum deposition. The intermediate product thus prepared and a nickel plate were immersed in a solution obtained by adding 100 ml of distilled water to 400 ml of a saturated aqueous solution of nickel acetate (II). Electrolysis was conducted for 30 minutes by applying a voltage of 1.26 to 1.4 V between the base body (cathode) and the nickel plate (anode) to seal the micropores of the protective layer. Thus, a desired reflector was obtained.

Although a 15% aqueous solution of sodium hydroxide was dripped on the protective layer of the reflecting mirror, the aluminum reflecting layer did not change.

COMPARATIVE EXAMPLE 2

A reflector was prepared in the same manner as in Example 2, except that electrolysis was not performed. When the aqueous sodium hydroxide solution was dripped on the protective layer, the protective layer was peeled off.

EXAMPLE 3

A reflector was prepared in the same manner as in Example 1, except that a polished steel plate of 0.5 mm thickness was used instead of the stainless steel plate. The reflector had the same chemical resistance as that prepared in Example 1.

EXAMPLE 4

An enamel was coated on one surface and the side faces of the polished steel plate of 0.4 mm thickness. Aluminum was vapor-deposited on that surface of the polished steel plate which was not coated with the enamel to a thickness of 1,500 Å and silicon dioxide was vapor-deposited thereon to a thickness of 2 $\mu$ to form the reflecting layer and the protective layer, respectively. This intermediate product was immersed in a solution obtained by adding 100 ml of distilled water to 100 ml of a saturated aqueous solution of cobalt (II) acetate for 30 minutes. Thereafter, the intermediate product was washed with distilled water and dried with air to prepare a desired reflector. This reflector had the same chemical resistance as that prepared in Example 1.

EXAMPLE 5

The intermediate product was prepared and coated with the acrylic resin as in Example 1. The intermediate product was immersed in an aqueous solution obtained by adding 100 ml of distilled water to 100 ml of a saturated aqueous solution of cobalt (II) citrate for 30 minutes. The intermediate product was removed from the solution, washed with distilled water and dried with air to obtain a desired reflector.

The reflector was treated with the aqueous solution of hydrochloric acid and the aqueous solution of sodium hydroxide as in Example 1, and the cellophane tape test was conducted. No fragment of the protective layer was sticked to the tape.

EXAMPLE 6

The intermediate product was prepared and coated with the acrylic resin as in Example 1. The product was immersed in boiling water for 5 minutes, and was removed from the water. After cooled to room temperature, the product was washed with distilled water and dried with air to obtain a desired reflector.

The reflector was treated with the solution of hydrochloric acid and the solution of sodium hydroxide as in Example 1, and the cellophane tape test was conducted. No fragment of the protective layer was sticked to the tape.

EXAMPLE 7

The intermediate product was prepared and coated with the acrylic resin as in Example 1. The product was allowed to stand in the saturated water vapor (steam) at 200° C. for one minute, and was removed from the water vapor. After cooled to room temperature, the product was washed with distilled water and dried with air.

The reflector was treated with the solution of hydrochloric acid and the solution of sodium hydroxide as in Example 1, and the cellophane tape test was conducted. No fragment of the protective layer was sticked to the tape.

What we claim is:

1. A reflector comprising: a base body made of a metallic material having an ionization potential substantially higher than that of aluminum; an aluminum reflecting layer vacuum deposited on one surface of said base body directly or through a smoothing layer formed on the base body; a light-transmitting water-insoluble inorganic oxide layer vacuum deposited on said reflecting layer; an insulating layer covering at least the other surface and peripheral sides of said base body; and a sealing agent comprising $H_2O$ or a carboxylate of an iron family element of low valence and sealing micropores of said inorganic oxide layer.

2. A reflector according to claim 1, wherein said reflecting layer is formed on said base body through the smoothing layer.

3. A reflector according to claim 2, wherein said smoothing layer is formed of an inorganic compound or a resin paint.

4. A reflector according to claim 2, wherein said insulating layer also covers peripheral side of said smoothing layer.

5. A reflector according to any one of claims 1 to 4, wherein said insulating layer also covers the peripheral side of said reflecting layer.

6. A reflector according to claim 5, wherein said insulating layer also covers peripheral side of said inorganic oxide layer.

7. A reflector according to claim 1, wherein said reflecting layer has a thickness of 500 to 2,000 Å.

8. A reflector according to claim 1, wherein said inorganic oxide layer has a thickness of 0.5 to 5 μm.

9. A method for manufacturing a reflector comprising the steps of:
    (a) forming a reflecting layer by vacuum depositing aluminum directly on one surface of a base body made of a metallic material having an ionization potential substantially higher than that of aluminum, or by vacuum depositing aluminum on one surface of said base body through a smoothing layer;
    (b) forming a light-transmitting protective layer on said reflecting layer by directly depositing a water-insoluble inorganic oxide material thereon to provide an intermediate product;
    (c) forming an insulating layer covering at least the other surface and the peripheral side of said base body; and
    (d) sealing micropores of said protective layer by treating with a sealing agent selected from the group consisting of $H_2O$ and a carboxylate of an iron family metal having a low valence.

10. A method according to claim 9, wherein said smoothing layer is formed on the surface of said base body.

11. A method according to claim 9 or 10, wherein said step (a) is conducted after said step (c).

12. A method according to claim 9 or 10, wherein said step (c) is conducted after said step (a), and said step (b) is conducted thereafter.

13. A method according to claim 9 or 10, wherein said step (c) is conducted after said steps (a) and (b).

14. A method according to claim 9 or 10, wherein said reflecting layer is formed to a thickness of 500 to 2,000 Å.

15. A method according to claim 9 or 10, wherein said protective layer is formed to a thickness of 0.5 to 5 μm.

16. A method according to claim 9, wherein the step (d) comprises immersing said protective layer in an aqueous solution of the carboxylate under atmospheric pressure or under pressurized conditions at a temperature of 0° to 200° C. for 1 second to 1 hour.

17. A method according to claim 9, wherein the step (c) comprises spraying said protective layer with an aqueous solution of the carboxylate at a temperature of 0° to 200° C.

18. A method according to claim 9, wherein the step (c) comprises conducting electrolysis in an aqueous solution of the carboxylate, using the base body of the intermediate product as a cathode, and a metal piece as an anode which is the same kind as the metal of the carboxylate used.

19. A method according to claim 18, wherein the electrolysis is performed at a voltage of 10 V or less and a current density of 500 mA/cm² or less for 5 seconds to 1 hour.

20. A method according to any one of claims 9, 17, 18 or 19, wherein a carboxylic acid component of the carboxylate is selected from the group consisting of acetic acid, propionic acid, butyric acid, lactic acid, citric acid, and tartaric acid.

21. A method according to claim 9, wherein the step (c) comprises immersing the protective layer in boiling water at a pH of 5 to 9 for a period of time within 20 minutes.

22. A method according to claim 9, wherein the step (c) comprises allowing the protective layer to stand in a saturated water vapor at a temperature of up to 200° C. for a period of time such that the protective layer is not peeled from the reflecting layer.

23. A method according to claim 22, wherein the step (c) is conducted at 100° C. for 5 to 20 minutes.

24. A method according to claim 22, wherein the step (c) is conducted at 150° C. for 2 to 10 minutes.

25. A method according to claim 22, wherein the step (c) is conducted at 200° C. for 1 to 5 minutes.

* * * * *

UNITED STATES PATENT AND TRADEMARK OFFICE
CERTIFICATE OF CORRECTION

PATENT NO. : 4,431,268
DATED : February 14, 1984
INVENTOR(S) : AKIRA OHNO et al

It is certified that error appears in the above-identified patent and that said Letters Patent are hereby corrected as shown below:

```
Delete "[30] Foreign Application Priority Data
     Jun. 26, 1980[JP] Japan....................55-87147"
```

Signed and Sealed this

Eighth Day of January 1985

[SEAL]

*Attest:*

*Attesting Officer*

GERALD J. MOSSINGHOFF

*Commissioner of Patents and Trademarks*